(12) United States Patent
Brockmann et al.

(10) Patent No.: US 6,535,097 B1
(45) Date of Patent: Mar. 18, 2003

(54) TRANSFORMER SYSTEM PROVIDED WITH A DECOUPLING SYSTEM

(75) Inventors: Olaf Brockmann, Hamburg (DE); Joerg Pscheidl, Hamburg (DE)

(73) Assignee: Kommanditgesellschaft Ritz Messwandler GmbH & Co., Hamburg (DE)

(*) Notice: Subject to any disclaimer, the term of this patent is extended or adjusted under 35 U.S.C. 154(b) by 0 days.

(21) Appl. No.: 09/508,750
(22) PCT Filed: Aug. 29, 1998
(86) PCT No.: PCT/EP98/05507
§ 371 (c)(1),
(2), (4) Date: May 10, 2000
(87) PCT Pub. No.: WO99/14772
PCT Pub. Date: Mar. 25, 1999

(30) Foreign Application Priority Data

Sep. 16, 1997 (DE) .......................... 197 40 664
Mar. 30, 1998 (DE) .......................... 198 14 034

(51) Int. Cl.⁷ ............................................. H01F 27/04
(52) U.S. Cl. ...................... 336/107; 336/96; 336/192
(58) Field of Search ........................ 336/90, 92, 96, 336/107, 192

(56) References Cited

U.S. PATENT DOCUMENTS 3,953,815 A * 4/1976 Raupach ...................... 336/90
4,731,599 A * 3/1988 Preissinger ................... 336/92

* cited by examiner

Primary Examiner—Lincoln Donovan
Assistant Examiner—Tuyen T. Nguyen
(74) Attorney, Agent, or Firm—Michael J. Striker

(57) ABSTRACT

To allow simple performance of a voltage test of a high-voltage system, a transformer system having a transformer housing (1) that receives a voltage converter (4) and having an electrical terminal (6) electrically connected to the voltage converter (4) and extended out of the transformer housing (1) for connecting the transformer system to a high- or medium-voltage system, is improved in that a decoupling system (12, 25) actuatable from outside the transformer housing (1) for temporarily interrupting the electrical connection between the voltage converter (4) and the first terminal (6) is disposed in the transformer housing (1). For performing a direct voltage test, the transformer system of the invention no longer has to be detached from the high-voltage system.

11 Claims, 3 Drawing Sheets

TRANSFORMER SYSTEM PROVIDED WITH A DECOUPLING SYSTEM

RELATED APPLICATIONS

Figure 1:
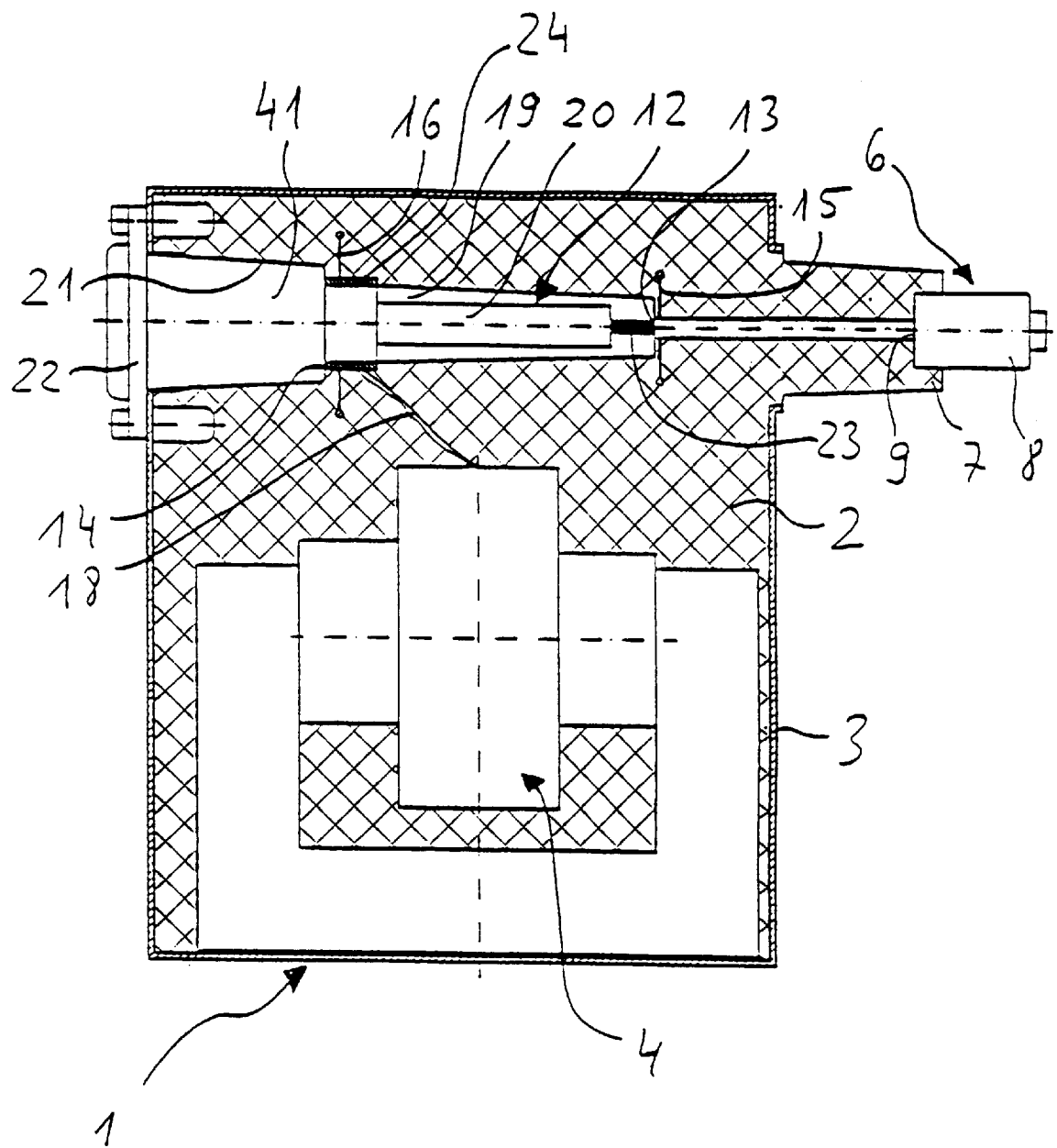

This application is a 371 of PCT/EP98/05507 filed Aug. 29, 1998.

BACKGROUND OF THE INVENTION

The invention relates to a transformer system having a transformer housing that receives a voltage converter and having an electrical terminal electrically connected to the voltage converter and extended out of the transformer housing for connecting the transformer system to a high- or medium-voltage system.

Such transformer systems are known. For constant monitoring of the high voltage, they are connected to high-voltage systems, such as switching stations, and typically mounted solidly. For maintenance or test purposes, however, the known transformer systems have to be detached. Particularly for a direct voltage cable test performed in the high-voltage system, an inductive voltage converter has to be removed; otherwise it would unavoidably be destroyed entirely when the test is performed.

In many high-voltage systems with sockets for the connection of high-voltage cables and voltage converters, the known transformer system also has to be detached for a different reason. Often there is no longer any unoccupied socket in the switching station to which a test cable for delivering the direct voltage can be connected. The voltage converter must then already be detached for that reason to allow the test cable to be connected to the socket previously occupied by the voltage converter.

To perform the voltage test, the following steps are necessary in the known systems:

The voltage converter is detached.

The socket that is now available is occupied by the test cable.

The direct voltage test is performed.

The test cable is detached.

The voltage converter is installed again.

Performing this procedure is time-consuming and expensive.

SUMMARY OF THE INVENTION

It is therefore the object of the present invention to disclose a transformer system of the type referred to at the outset with which a voltage test in a high-voltage system can be performed more simply.

This object is attained according to the invention in that a decoupling system actuatable from outside the transformer housing for temporarily interrupting the electrical connection between the voltage converter and the first terminal is disposed in the transformer housing.

The transformer system of the invention permits the electrical decoupling of the voltage converter from the high-voltage system without having to detach anything. The direct voltage test can then be performed without destroying the voltage converter.

In a further feature of the invention, it is provided that a further electrical terminal extended to the outside is provided, which is connected to the first electrical terminal via a connection capable of carrying current. A test cable for the direct voltage supply can, again without detachment of the transformer system, be connected to the further electrical terminal extended to the outside. The connection capable of carrying current according to the invention reliably carries the test voltages or currents on to the first electrical terminal connected to the high-voltage system.

If the first electrical terminal is embodied as a plug contact for being plugged into a socket of a high-voltage system, and the further electrical terminal is embodied as a socket, then the transformer system of the invention can be connected in an especially simple way to the high-voltage system and the test cable. With a view to compatibility, it is especially expedient here if the bush and the plug contact are embodied as an inside cone in accordance with German Industrial Standard DIN 47637 or as an outside cone in accordance with DIN 47636.

A first embodiment of the invention provides that the insulation is embodied of cast resin; that the decoupling system has two contacts embedded in the cast resin and one hollow chamber, into which a bridge element serving the purpose of electrical connection of the contacts can be inserted. Thus all the components can be embedded in the cast resin housing in a single operation, and the voltage-carrying parts are also electrically insulated in the same operation.

In a further feature of the invention, it is provided that the hollow chamber, accessible from outside through an introduction opening of the transformer housing, is embodied conically and the bridge element is embodied in rod form; that the contacts are disposed on the axial ends of the hollow chamber; and that the bridge element can be introduced into and retracted out of the conical hollow chamber axially through the introduction opening. Because of its rod form, the bridge element can be installed in a simple way by being plugged axially into the conical hollow chamber. In the process, it is guided by the conical form of the hollow chamber precisely to the rear contact, against which it has to be pressed.

If the introduction opening is embodied in the form of a bush, preferably in the form of a conventional high-voltage socket, in particular in accordance with the aforementioned DIN standard, and is closable by means of a cap, then for construction and manufacture a standardized shape that has already been used many times in other contexts and has stood the test of time can be employed, which reduces construction and production costs.

The provision of a dummy cable plug disposed in the introduction opening between the bridge element (20) and the cap assures the conditions for touch protection, because of the high-voltage strength of the dummy cable plug.

The provision that on being inserted, the bridge element can be pressed against the first contact, disposed opposite the introduction opening, via an axially acting spring element assures simple and reliable contacting as the bridge element is being plugged in.

If the second contact, disposed on the end of the hollow chamber toward the introduction opening, is embodied as a contact ring, with a through opening and axially acting contact element, then the bridge element can be introduced without problems through the contact ring into the conical hollow chamber. After that, a secure electrical contact is made by means of the axially acting contact elements.

In a refinement of the invention, the hollow chamber, in the decoupled state, can be provided not with the removed dummy cable plug and bridge element but instead with a special dummy plug of an elastic material, which fills up the hollow chamber and decouples the two contacts from one another in a high-voltage-proof fashion. By this provision the internal decoupling distance between the two contacts can be reduced to a minimum spacing because the elastic dummy plug presses flat against the inner surfaces of the hollow chamber and in particular against the contact faces as well and in the process positively displaces the air out of the ac. This prevents sparkovers that could otherwise occur between the contacts in the air-filled hollow chamber. Along with this provision, however, the total dimensions of the transformer housing, its weight, and the production costs are also reduced.

The invention can be improved still further by providing that the dummy plug is connected to a cap part that can be screwed instead of the cap to the transformer housing. The dummy plug with a cap plug guarantees the conditions for touch protection, because of its high-voltage strength.

Further advantages and details of the invention will become apparent from the ensuing description of exemplary embodiments in conjunction with the drawings.

BRIEF OF DESCRIPTION OF THE DRAWING

Figure 2:
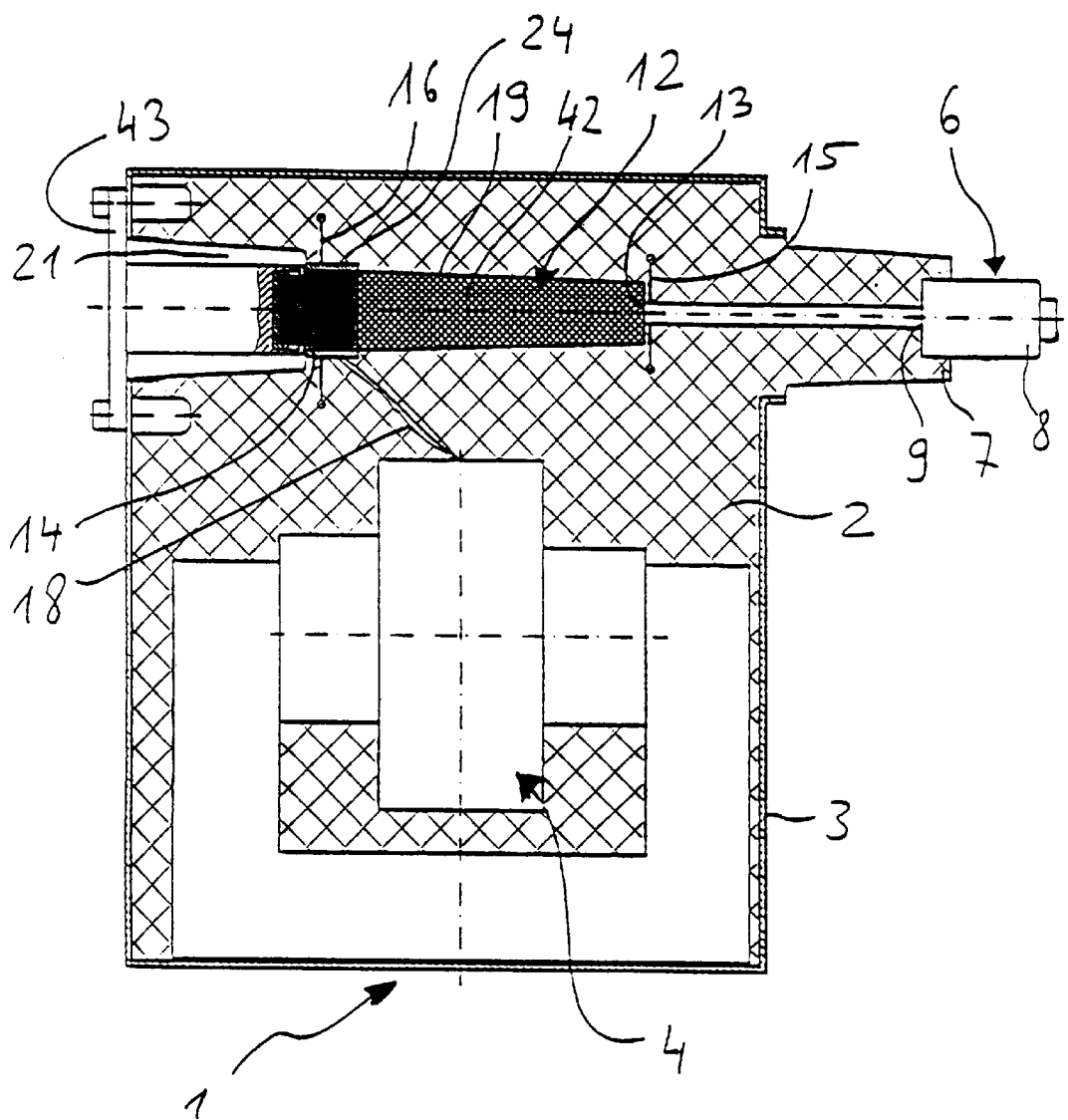
Figure 3:
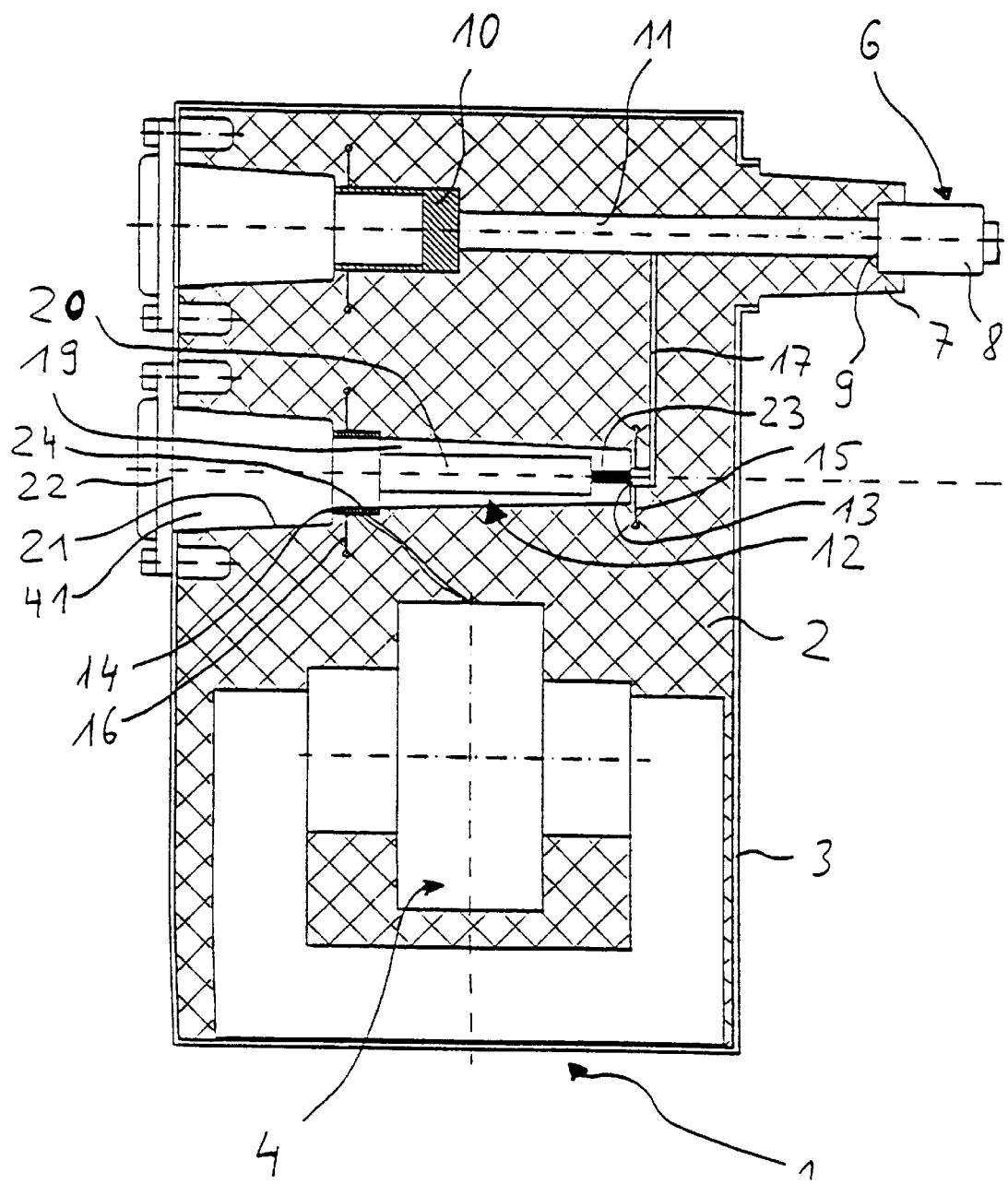

Individually, the drawings show:

FIG. 1, a first exemplary embodiment of a transformer system of the invention in section;

FIG. 2, the same transformer system as in FIG. 1, in the decoupled state;

FIG. 3, a second exemplary embodiment of a transformer system of the invention, in section.

DESCRIPTION OF THE PREFERRED EMBODIMENTS

The transformer system of the invention shown in the drawings has a transformer housing 1 of cast resin 2 with a metal jacket 3. An inductive voltage converter 4 is disposed in the transformer housing 1.

For electrically connecting the transformer system with a high-voltage-carrying socket, not shown, of a high-voltage system, a plug contact 6 which protrudes laterally past the transformer housing 1 is provided as a first electrical terminal. The plug contact 6 comprises an insulator part 7, a metal contact 8, and a conductor 9.

In the embodiment shown in FIG. 3, a socket 10, which is connected to the conductor 9 of the plug contact 6 via a connection 11 capable of carrying current, is disposed on the side of the transformer housing 1 opposite the plug contact 6.

In both embodiments, a decoupling system 12, which has two opposed contacts 13, 14, is also disposed in the transformer housing 1. The contacts are each provided with field control electrodes 15, 16. The first contact 13 is connected directly (FIGS. 1 and 2) or indirectly via a connecting line 17 (FIG. 3) with the conductor 9 of the plug contact 6 or with the connection 11 that is capable of carrying current. The second contact 14 is connected to the other supply line 18 of the voltage converter 4. A conical hollow chamber 19 is embodied between the two contacts 13, 14 and the cast resin 2, so that the contacts 13, 14 are disposed on the axial ends of the hollow chamber 19. A rod-like bridge element 20 serving to connect the two contacts 13, 14 electrically is disposed in the hollow chamber 19 and is embodied here as a cylindrical conductor, but can also comprise a rod-shaped fuse.

The hollow chamber 19 of the decoupling system 12 is accessible from outside the transformer housing 1 via a introduction opening 21 embodied as a conventional high-voltage socket. The introduction opening 21 can be closed with a cap 22, which is screwed from outside onto the transformer housing 1. Once the cap 22 has been taken off, the bridge element 20 can be axially introduced into the hollow chamber 19 or removed through the introduction opening 21. After that, the introduction opening 21 is provided with a dummy cable plug 41 enclosed with the cap 22. Because of its high-voltage strength, the dummy cable plug 41 assures the conditions for touch protection.

Disposed between the first contact and the bridge element 20 is an axially acting spring element 23, against which the bridge element 20 is pressed axially on being introduced into the hollow chamber 19. The bridge element 20 is guided by the conical shape of the hollow chamber 19 precisely onto the contact 13, and a secure electrical contacting is thus attained. The second contact 14 is embodied as a contact ring 24 with a through opening, through which the bridge element 20 is thrust. In the final position, axially acting contact elements thus assure a secure electrical connection with the bridge element 20. The functional state is thus achieved.

For achieving the decoupled state, the dummy cable plug 41 is removed while the system is voltage-free, and the bridge element 20 is pulled out of the hollow chamber 19. After that, the hollow chamber is filled up by a special dummy plug 42 of an elastic material, preferably silicon, which decouples the two contacts 13, 14 from one another (FIG. 2) in high-voltage-proof fashion. The dummy plug 42 is connected to a cap part 43, which is screwed instead of the cap 22 to the transformer housing 1. Because the dummy plug 42 conforms closely to the contact faces and the walls of the hollow chamber 19, the internal decoupling distance between the two contacts 13, 14 can be reduced to a very much lesser spacing than would be necessary if only air were located between the contacts 13, 14. This also reduces the total dimensions, weight and production cost of the transformer housing 1. Because of its high-voltage strength, the dummy plug 42 with the cap part 43 assures the conditions for touch protection.

List of Reference Numerals

1 Transformer housing
2 Cast resin
3 Metal jacket
4 Voltage converter
6 Plug contact
7 Insulator part
8 Metal contact
9 Conductor
10 Socket
11 Connection
12 Decoupling system
13 First contact
14 Second contact
15 Field control electrode
16 Field control electrode
17 Connecting line
18 Supply line
19 Hollow chamber
20 Bridge element
21 Introduction opening
22 Cap
23 Spring element
24 Contact ring
41 Dummy cable plug
42 Cap part

What is claimed is:

1. A transformer system, comprising a transformer housing; a voltage converter received in said transformer housing; a first electrical terminal electrically connected to said voltage converter and extended out of said transformer housing for connection to a high-or medium-voltage system; a second electrical terminal extended to an outside and connected to said electrical terminal via a current carrying connection; and a decoupling system disposed in said transformer housing and actuatable from outside of said transformer housing for temporarily interrupting an electrical connection between said voltage convertor and said first terminal.

2. A transformer system as defined in claim 1, wherein said first electrical terminal is formed as a plug contact for plugging into a socket of a high-voltage system, while said second electrical terminal is formed as a socket.

3. A transformer system, comprising a transformer housing; a voltage convertor received in said transformer housing; a first electrical terminal electrically connected to said voltage convertor and extended out of said transformer housing for connection to a high- or medium-voltage system; a decoupling system disposed in said transformer housing and actuatable from outside of said transformer housing for temporarily interrupting an electrical connection between said voltage convertor and said first terminal; and an insulation composed of cast resin, said decoupling system having two contacts embodied in said cast resin, a hollow chamber and a bridge element located in said hollow chamber for electrical connection of said contacts with one another.

4. A transformer system as defined in claim 3, wherein said transformer housing has an introduction opening for making access to said hollow chamber, said hollow chamber being conical and said bridge element being rod-shaped, said contacts being disposed on axial ends of said hollow chamber, said bridge element being introducible into and retractable out of said conical hollow chamber axially through said introduction opening.

5. A transformer system as defined in claim 4, wherein said introduction opening is formed as a bush; and further comprising a cap closing said introduction opening.

6. A transformer system as defined in claim 5; and further comprising a dummy cable plug disposed in said introduction opening between said bridge element and said cap.

7. A transformer system as defined in claim 3; and further comprising an axially acting spring element which presses said bridge element against said first contact.

8. A transformer system as defined in claim 4; and further comprising a second contact disposed on an end of said hollow chamber toward said introduction opening, said second contact being formed as a contact ring with a through opening and an axially acting contact element.

9. A transformer system as defined in claim 3; and further comprising a dummy plug composed of an elastic material and filling up said hollow chamber so as to decouple said contacts from one another.

10. A transformer system as defined in claim 9; and further comprising a cap which closes said introduction opening, and screwed to said transformer housing, said dummy plug being connected to said cap.

11. A transformer system, comprising a transformer housing; a voltage converter received in said transformer housing, a first electrical terminal electrically connected to said voltage converter and extended out of said transformer housing for connection to a high-or medium-voltage system; a second electrical terminal extended to an outside and connected to said electrical terminal via a current carrying connection; a decoupling system disposed in said transformer housing and actuatable from outside of said transformer housing for temporarily interrupting an electrical connection between said voltage convertor and said first terminal; and an insulation composed of cast resin, said decoupling system having two contacts embodied in said cast resin, a hollow chamber and a bridge element located in said one hollow chamber for electrical connection of said contacts with one another.

* * * * *